(12) United States Patent
Kwon et al.

(10) Patent No.: US 8,512,869 B2
(45) Date of Patent: Aug. 20, 2013

(54) SILICON COMPOSITION AND ORGANIC LIGHT EMITTING DEVICE INCLUDING THE SAME

(75) Inventors: Oh-June Kwon, Yongin (KR); Seung-Yong Song, Yongin (KR); Young-Seo Choi, Yongin (KR); Ji-Hun Ryu, Yongin (KR); Young-Cheol Joo, Yongin (KR); Jin-Hwan Jeon, Yongin (KR); Sun-Young Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/094,187

(22) Filed: Apr. 26, 2011

(65) Prior Publication Data

US 2011/0301293 A1    Dec. 8, 2011

(30) Foreign Application Priority Data

Jun. 8, 2010   (KR) ........................ 10-2010-0053990

(51) Int. Cl.
*B32B 9/04* (2006.01)
*C08L 83/04* (2006.01)

(52) U.S. Cl.
USPC ............. 428/447; 525/477; 525/478; 528/15; 528/31; 528/32

(58) Field of Classification Search
None
See application file for complete search history.

(56) References Cited

U.S. PATENT DOCUMENTS

| | | | |
|---|---|---|---|
| 5,977,226 A * | 11/1999 | Dent et al. | 524/267 |
| 6,472,078 B1 * | 10/2002 | Shudo et al. | 428/447 |
| 7,521,813 B2 * | 4/2009 | Kashiwagi et al. | 257/791 |
| 2006/0159937 A1 * | 7/2006 | Miyoshi et al. | 428/447 |
| 2010/0103507 A1 * | 4/2010 | Imazawa et al. | 359/350 |
| 2012/0153818 A1 * | 6/2012 | Okawa et al. | 313/512 |

FOREIGN PATENT DOCUMENTS

| | | | |
|---|---|---|---|
| KR | 1020050007183 A | | 1/2005 |
| KR | 1020060024459 A | | 3/2006 |
| KR | 1020080008286 A | | 1/2008 |
| KR | 1020090015303 A | | 2/2009 |

OTHER PUBLICATIONS

Definition for "filler" as defined by Hawley's Condensed Chemical Dictionary, 14$^{th}$ Edition, 2002 John Wiley & Sons.*

* cited by examiner

*Primary Examiner* — Marc Zimmer
(74) *Attorney, Agent, or Firm* — Knobbe Martens Olson & Bear LLP

(57) ABSTRACT

A silicon composition with a silicon compound represented by Formula 1 and a silicon compound represented by Formula 2:

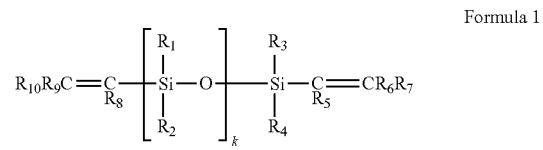

Formula 1

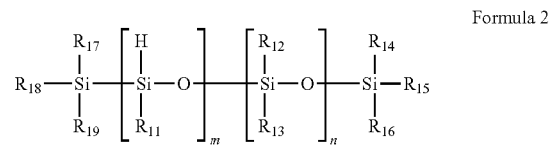

Formula 2 wherein,
$R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently a $C_1$-$C_4$ alkyl group,
$R_5$, $R_6$, $R_7$, $R_8$, $R_9$, and $R_{10}$ are each independently hydrogen or deuterium,
k, m, and n are positive integers,
and the ratio of k to the sum of m and n is from about 1:0.001 to about 1:0.2;
and an organic light emitting device including the same.

9 Claims, 2 Drawing Sheets

DEFECTS OCCURRENCE
IN EMISSION LAYER

SILICON COMPOSITION AND ORGANIC LIGHT EMITTING DEVICE INCLUDING THE SAME

CROSS-REFERENCE TO RELATED APPLICATIONS

This application claims the benefit of Korean Patent Application No. 10-2010-0053990, filed on Jun. 8, 2010, in the Korean Intellectual Property Office, the disclosure of which is incorporated herein in its entirety by reference.

BACKGROUND

1. Field

One or more embodiments relate to a silicon composition and an organic light emitting device including the same.

2. Description of the Related Technology

Along with liquid crystal displays (LCDs) and plasma display panels (PDPs), recently, organic light emitting devices received much attention as the next generation of display devices.

An organic light emitting device includes a positive electrode, a negative electrode, and an organic material layer interposed between the positive electrode and the negative electrode. When a voltage is applied between the positive electrode and the negative electrode, electrons and holes are injected into the organic material layer. Then, the electrons and the holes are re-combined with each other in the organic material layer, thereby generating light.

However, the organic material layer is vulnerable to humidity. Accordingly, in order to smoothly operate the organic light emitting device and to increase the lifetime thereof, the organic material layer should be sealed to prevent permeation of water molecules.

SUMMARY

One or more embodiments include a silicon composition that does not cause formation of a dark spot in an organic light emitting device panel.

One or more embodiments include an organic light emitting device including the silicon composition as a filler.

Additional aspects will be set forth in part in the description which follows and, in part, will be apparent from the description, or may be learned by practice of the presented embodiments.

According to one or more embodiments, a silicon composition comprises a silicon compound represented by Formula 1 la 1 and a silicon compound represented by Formula 2:

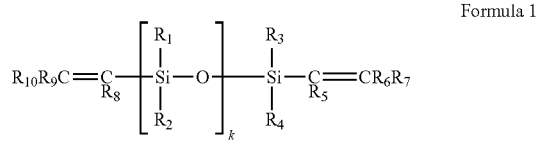

Formula 1

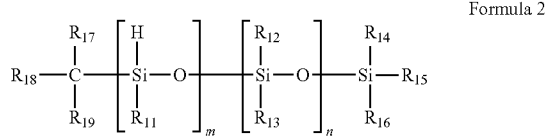

Formula 2 wherein, $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently a $C_1$-$C_4$ alkyl group, $R_5$, $R_6$, $R_7$, $R_8$, $R_9$, and $R_{10}$ are each independently hydrogen or deuterium, k, m, and n are positive integers, and a ratio of k to the sum of m and n is in the range of 1:0.001 to 1:0.2.

According to an embodiment, $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently methyl, ethyl, n-propyl, iso-propyl, n-butyl, sec-butyl, or t-butyl, and R5, R6, R7, R8, R9, and R10 is each independently a hydrogen atom.

According to an embodiment, the silicon compound represented by Formula 1 may be a silicon compound represented by Formula 3:

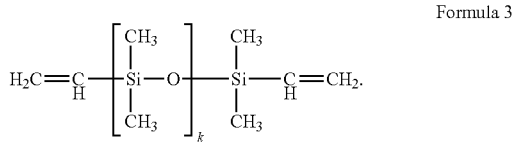

Formula 3

According to an embodiment, the silicon compound represented by Formula 2 may be a silicon compound represented by Formula 4:

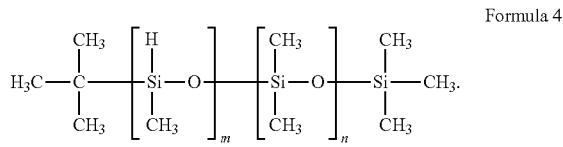

Formula 4

According to an embodiment, when $100 \leq k \leq 1{,}000$, $0.1\, k \leq m+n \leq k$.

According to an embodiment, when $1{,}000 < k \leq 2{,}000$, $0.005\, k \leq m+n \leq 0.5\, k$.

According to an embodiment, $0.5Y \leq mX \leq 3Y$, wherein X is a mole ratio of the silicon compound represented by Formula 2 and Y is a mole ratio of the silicon compound represented by Formula 1.

According to one or more embodiments, an organic light emitting device includes the silicon composition described above as a filler.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
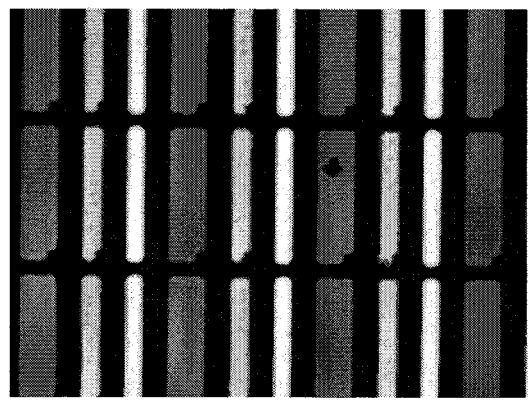
FIG. 1A shows an image of an organic light emitting device panel in which dark spots are formed.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In a silicon composition, for example, polydimethylsiloxane (PDMS) polymer, a main polymer for curing has vinyl groups at opposite ends and the vinyl groups are cross-linked to an H-polymer to incur rigidity.

The H-polymer has Si—H (silane) groups that are highly reactive to an organic material of an organic light emitting device.

The H-polymer permeates through small dents formed in an organic light emitting device panel and induces formation of dark spots in the organic light emitting device panel.

FIG. 1A shows an image of an organic light emitting device panel in which dark spots are formed.

The dark spots are formed due to different mobility rates of the H-polymer and the main polymer since the H-polymer is highly reactive and very small compared to the main polymer.

Figure 1B:
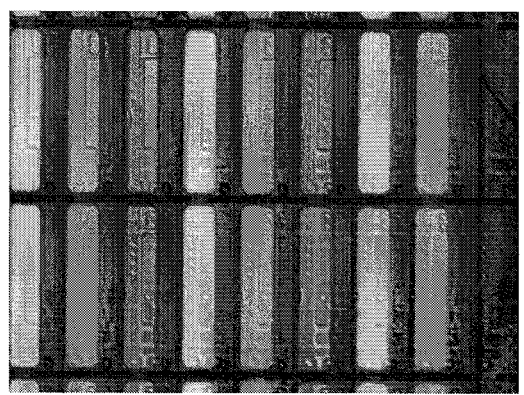
FIG. 1B shows an image of an organic light emitting device panel in which dark spots are not formed.
Figure 2A:
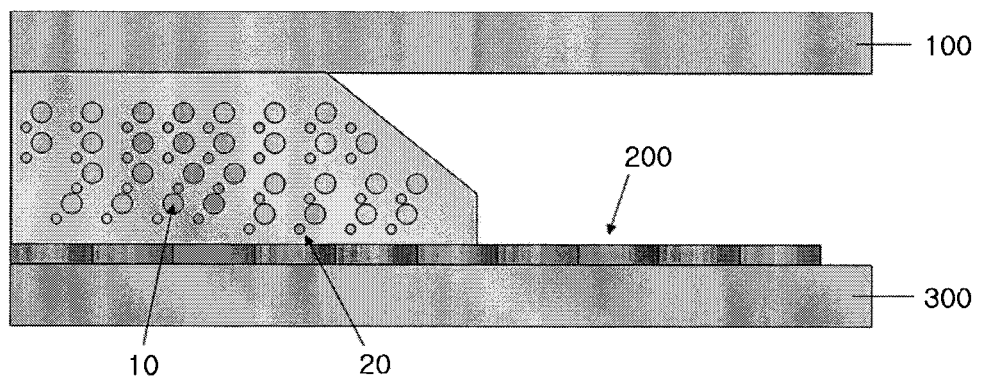
FIGS. 2A and 2B are schematic views illustrating a defect formation process caused by different mobility rates of a main polymer (vinyl polymer) and a H-polymer in an organic light emitting device panel.
Figure 2B:
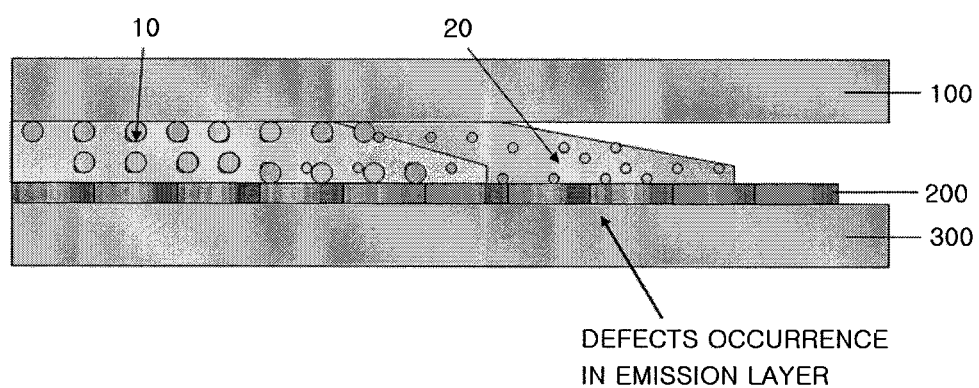

FIGS. 2A and 2B are schematic views illustrating a defect formation process in the organic light emitting device panel of FIG. 1 caused by different mobility rates of the main polymer (vinyl polymer) and the H-polymer.

As illustrated in FIG. 2A, when a silicon composition including a main polymer (for example, vinyl polymer) 10 and a H-polymer 20 is coated on an organic light emitting unit 200 formed on a substrate 300 and then the resultant structure is covered by an encapsulation substrate 100 and a pressure is applied thereto, as illustrated in FIG. 2B, due to the different mobility rates of the main polymer 10 and the H-polymer 20, the H-polymer 20, which has higher mobility rate than the main polymer 10, moves in one direction.

The H-polymer 20 permeates into the organic light emitting unit 200 through small dents contacting a H-polymer leaning portion and the highly reactive Si—H of the H-polymer 20 reacts with an organic material of the organic light emitting unit 200. Thus, defects occur in the organic light emitting device panel.

In a silicon composition according to present embodiments, a difference in mobility rates of a main polymer and an H-polymer is reduced to prevent the formation of the H-polymer leaning portion.

A silicon composition according to an embodiment includes a silicon compound represented by Formula 1 and a silicon compound represented by Formula 2:

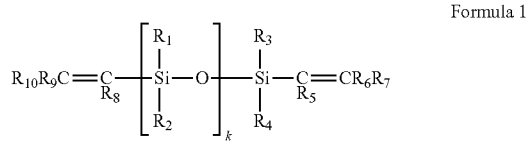

Formula 1

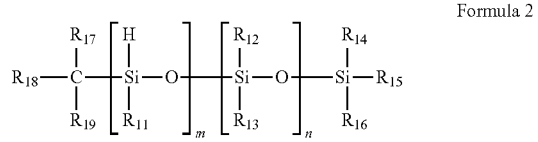

Formula 2 wherein $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently a $C_1$-$C_4$ alkyl group, and $R_5$, $R_6$, $R_7$, $R_8$, $R_9$, and $R_{10}$ are each independently hydrogen or deuterium, k, m, and n are positive integers, and a ratio of k to the sum of m and n is in the range of 1:0.001 to 1:0.2.

According to an embodiment, $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently methyl, ethyl, n-propyl, iso-propyl, n-butyl, sec-butyl, or t-butyl, and $R_5$, $R_6$, $R_7$, $R_8$, $R_9$, and $R_{10}$ is each independently a hydrogen atom.

According to an embodiment, the silicon compound represented by Formula 1 may be a silicon compound represented by Formula 3:

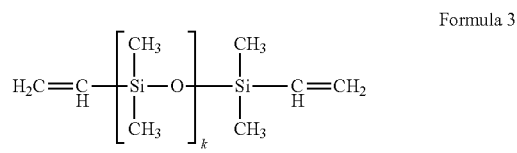

Formula 3

According to an embodiment, the silicon compound represented by Formula 2 may be a silicon compound represented by Formula 4:

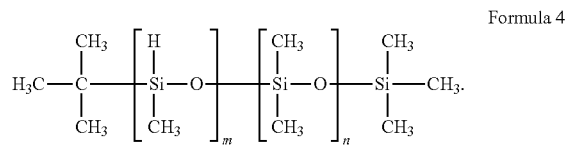

Formula 4

Normally, the H-polymer (corresponding to FIGS. 2 and 4) has m Si—H groups and the main polymer (a vinyl-polymer corresponding to Formulae 1 and 3) has two vinyl groups at opposite ends. Since the m Si—H groups are bonded to the two vinyl groups, a ratio of the main polymer to the H-polymer in the silicon composition may be

[mole number of the main polymer]×2=m(mole number of H-polymer).

Accordingly, in regard to the silicon composition (for example, PDMS curing polymer) which is cured when heated, the mole number of the main polymer (vinyl polymer) is greater than the mole number of the H-polymer, and in this case, the H-polymer particles are small and thus the small H-polymer particles damage an organic light emitting device.

For example, in the silicon composition, when k of the vinyl polymer that is the main polymer is 1000, in the case that n is 0, the number of Si—H groups in the H-polymer should be 2000 (that is, 1000×2). Thus, in order to include the same number of Si—H groups, conventionally, one polymer containing 2000 Si—H (m=2000) or 1000 polymers each containing two Si—H (m=2) are used.

When 1,000 polymers each containing two Si—H (m=2) are used, the size of the H-polymer is as small as 2/1,000 of the vinyl polymer that is the main polymer. Due to the small size, the H-polymer moves very quickly. If the vinyl polymer that is the main polymer and the H-polymer exist in a mixture form, when the mixture is compressed due to external pressure, as illustrated in FIG. 2B, small H-polymers spread toward the outermost region of the organic light emitting device panel and react with an emission unit of the organic light emitting device panel.

In order to prevent the reaction, a dialkyl siloxane (for example, dimethyl siloxane) is additionally included, in addition to Si—H, so as to increase the size of the H-polymer and reduce the mobility rate of the H-polymer. Thus, a filling solution-derived defect less occurs.

According to an embodiment, when $100 \leq k \leq 1,000$, $0.1 k \leq m+n \leq k$.

When k, m, and n are positive integers, k is equal to or greater than 100 and equal to or less than 1,000, and m+n is equal to or greater than 0.1 k and equal to or less than k, the mobility rate of the H-polymer is decreased as described above and thus, the emission unit of the organic light emitting device is not damaged.

According to another embodiment, when $1,000 < k \leq 2,000$, $0.005\ k \leq m+n \leq 0.5\ k$.

When k, m, and n are positive integers, k is greater than 1,000 and equal to or less than 2,000, and m+n is equal to or greater than 0.005 k and equal to or less than 0.5 k, the mobility rate of the H-polymer is decreased as described above and thus, the emission unit of the organic light emitting device is not damaged.

According to another embodiment, $0.5Y \leq mX \leq 3Y$, wherein X is a mole ratio of the H-polymer that constitutes the silicon compound represented by Formula 2, and Y is a mole ratio of the main polymer that constitutes the silicon compound represented by Formula 1.

When the relationship between the mole ratio of the H-polymer that constitutes the silicon compound represented by Formula 2 and the mole ratio of the main polymer that constitutes the silicon compound represented by Formula 1 satisfies the inequality described above, the ratio of the number of the functional groups of the H-polymer to the number of the functional groups of the main polymer approaches near 1:1.

An organic light emitting device according to an embodiment includes the silicon composition as a filler.

Hereinafter, the structure of an organic light emitting device will be described in detail.

The organic light emitting device according to the present embodiment may have various structures. The organic light emitting device may include an organic layer between a first electrode and a second electrode, wherein the organic layer includes at least one layer selected from the group consisting of a hole injection layer, a hole transport layer, an emission layer a hole blocking layer, and an electron injection layer.

For example, the organic light emitting device according to the present embodiment may have a first electrode/hole injection layer/hole transport layer/emission layer/electron transport layer/electron injection layer/second electrode structure, or a first electrode/hole injection layer/hole transport layer/ emission layer/hole blocking layer/electron transport layer/ electron injection layer/second electrode structure.

Hereinafter, an embodiment of a method of manufacturing an organic light emitting device having the structures described above will be described in detail.

First, an anode (positive electrode) forming material having a high work function is deposited on a substrate by deposition or sputtering to form an anode, and the anode constitutes a first electrode. The substrate may be a substrate conventionally used in organic electroluminescence (EL) devices, and may be a glass substrate or plastic substrate having excellent transparency, surface planarity, ease of handling, and high water-repellency. The anode forming material may be ITO, IZO, $SnO_2$, or ZnO, which are transparent and highly conductive.

A hole injection layer-forming material is then vacuum thermo-deposited or spin coated on the anode. Examples of the hole injection layer-forming material are, but are not limited thereto, a phthalocyanine compound, such as CuPc or copper phthalocyanine; a star-burst type amine derivative, such as TCTA, m-MTDATA, and m-MTDAPB; and soluble and conductive polymer such as polyaniline/dodecylbenzenesulfonic acid (Pani/DBSA), poly(3,4-ethylenedioxythiophene)/poly(4-styrenesulfonate (PEDOT/PSS): polyaniline/camphor sulfonic acid (Pani/CSA), and (polyaniline)/poly(4-styrenesulfonate) (PANI/PSS):

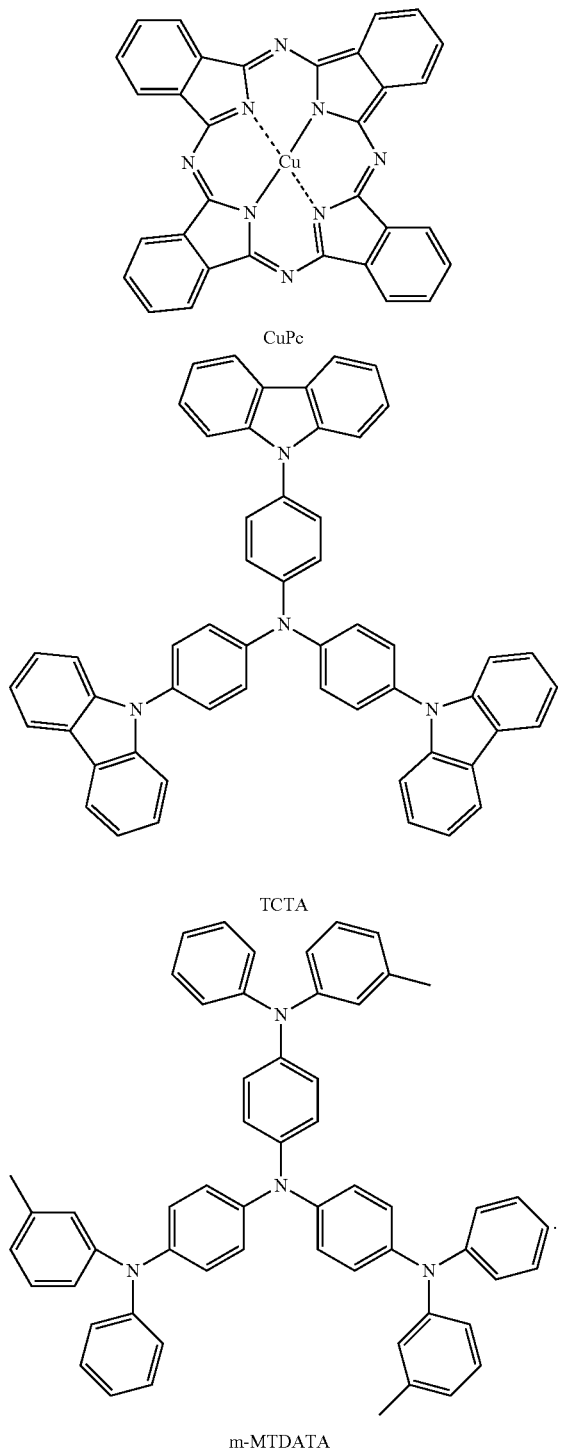

A hole transport layer-forming material is vacuum thermo-deposited or spin coated on the hole injection layer to form a hole transport layer. The hole transport layer-forming material may be, for example, 1,3,5-tricarbazolylbenzene, 4,4'-biscarbazolylbiphenyl, polyvinyl carbazole, m-biscarbazolylphenyl, 4,4'-biscarbazolyl-2,2'-dimethylbiphenyl, 4,4', 4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)benzene, 1,3,5-tris(2-carbazolyl-5-methoxyphenyl)benzene, bis(4-carbazolyl)silane, N,N'-bis(3-methylphenyl)-N,N'-diphenyl-[1,1-biphenyl]-4,4'-diamine (TPD), N,N'-di(naphthalen-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine (TFB), or poly(9,9-dioctylfluorene-co-bis-(4-butylphenyl-bis-N,N-phenyl-1,4-phenylenediamine (PFB), but is not limited thereto:

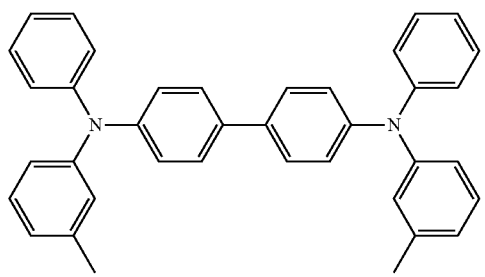

TPD

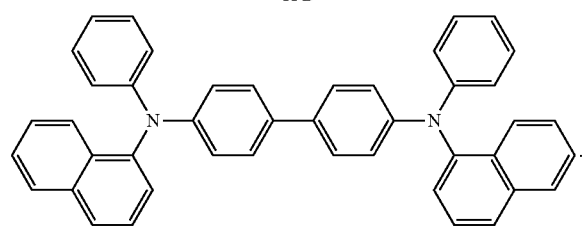

α-NPD

Next, an emission layer is formed on the hole transport layer. An emission layer-forming material is not particularly limited, and may include a host such as 4,4'-biscarbazolylbiphenyl (CBP), TCB, TCTA, SDI-BH-18, SDI-BH-19, SDI-BH-22, SDI-BH-23, dmCBP, Liq, TPBI, Balq, or BCP, and a fluorescent dopant such as IDE102 or IDE105 which are available from Idemitsu Co. (Shanghai, China), or a green phosphorescent dopant Ir(ppy)$_3$, or a blue phosphorescent dopant (4,6-F$_2$ppy)$_2$Irpic may be vacuum thermo-deposited together:

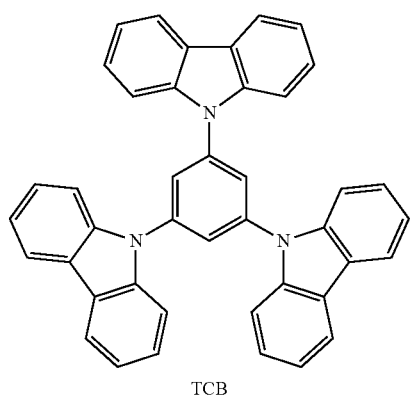

TCB

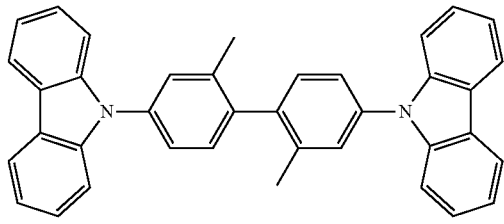

dmCBP

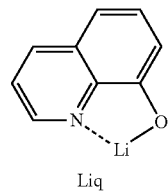

Liq

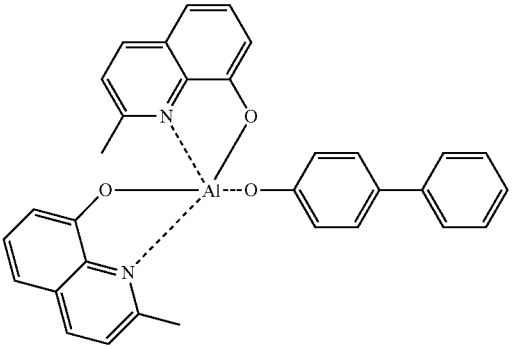

Balq

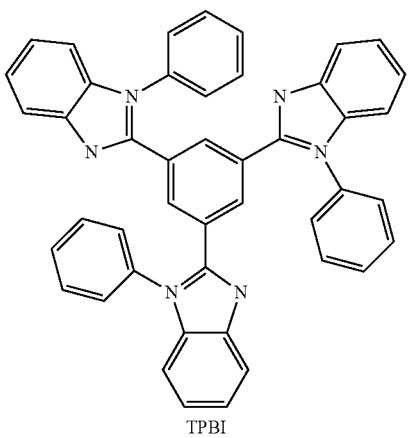

TPBI

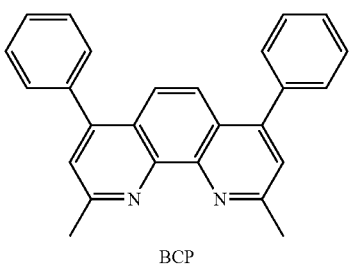

BCP

-continued

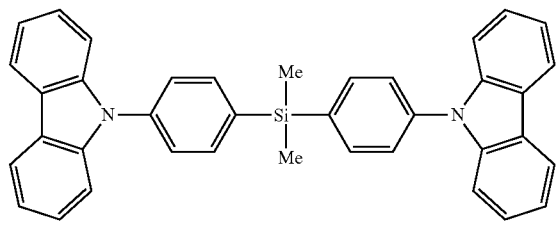

SDI-BH-18

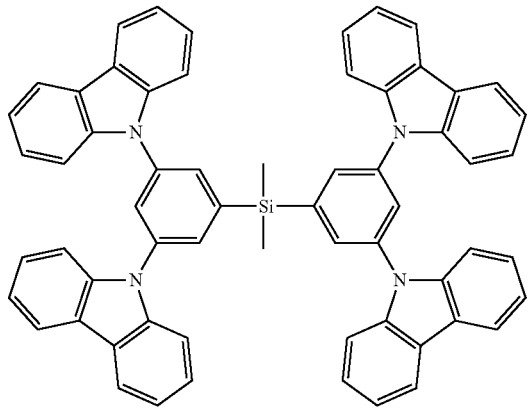

SDI-BH-19

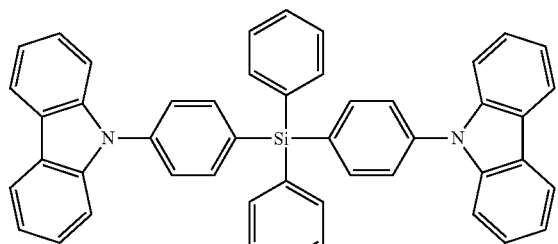

SDI-BH-22

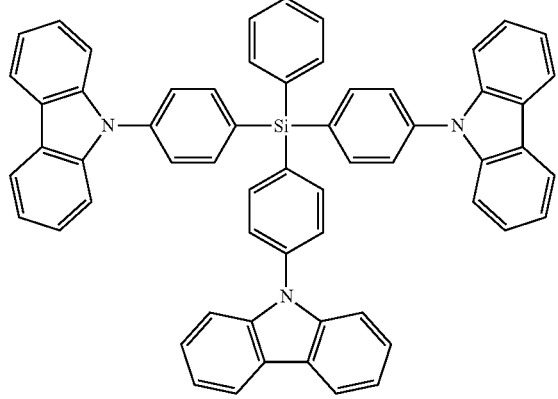

SDI-BH-23

The doping concentration is not particularly limited, and may conventionally be within the range of about 0.5 to about 12 weight(wt) %. An electron transport layer may be formed on the emission layer by vacuum deposition or spin coating.

If phosphorescent dopants are used in the emission layer, a hole blocking layer-forming material may be additionally vacuum thermo-deposited on the electron transport layer to form a hole blocking layer, in order to prevent diffusion of triplet excitons or holes into the electron transport layer. The hole blocking layer material is not particularly limited, but may have a higher ionizing potential than an electroluminescent compound and also retains electron transporting abilities. In this regard, the hole blocking layer material may be Balq or BCP.

An electron transport layer may be formed on the hole blocking layer by vacuum deposition or spin coating.

An electron transport layer-forming material may be any known electron transporting material such as Alq3.

An electron injection layer may be formed on the electron transport layer.

An electron injection layer-forming material may be, for example, LiF, NaCl, CsF, $Li_2O$, or BaO, but is not limited thereto.

A cathode forming metal may be vacuum thermo-deposited on the electron injection layer to form a cathode. The cathode forming metal may be lithium (Li), magnesium (Mg), aluminum (Al), aluminum-lithium (Al—Li), calcium (Ca), magnesium-indium (Mg—In), or magnesium-silver (Mg—Ag). In order to produce a top-emission light emitting device, a light-transmissible cathode comprising, for example, ITO or IZO may be used as the cathode.

Then, a silicon composition including the silicon compound represented by Formula 1 and the silicon compound represented by Formula 2 according to an embodiment as a filler may be loaded onto the cathode and then an encapsulation substrate is compressed to completely form the organic light emitting device.

The present embodiments will be described in further detail with reference to the following examples. These examples are for illustrative purposes only and are not intended to limit the scope of the present embodiments.

EXAMPLES

Example 1

$100 \leq k \leq 1000$

A 15 Ω/cm² (1,200 Å) ITO glass substrate (available from Corning Co. (Corning, N.Y.)) was cut to a size of 50 mm×50 mm×0.7 mm, sonicated with isopropyl alcohol and pure water for 5 minutes each time, and then washed with UV ozone for 30 minutes. m-MTDATA was vacuum deposited on the ITO glass substrate to form a hole injection layer having a thickness of 750 Å. Then, α-NPD was vacuum deposited on the hole injection layer to form a hole transport layer having a thickness of 150 Å. DSA as a host and 3% TBPe as a dopant were vacuum deposited on the hole transport layer to form an emission layer having a thickness of 300 Å. Then, Alq3 was vacuum deposited on the emission layer to form an electron transport layer having a thickness of 200 Å. Thereafter, LiF and Al were sequentially vacuum deposited on the electron transport layer to form an electron injection layer having a thickness of 80 Å and a negative electrode having a thickness of 3000 Å, respectively, thereby completely forming a LiF/Al electrode.

Then, a silicon composition including the polymer of Formula 3 and the polymer of Formula 4 in a mole ratio of 70:30 as a filler was loaded onto the LiF/Al electrode and then, covered by an encapsulation substrate, and the resultant structure was compressed and cured at a temperature of 80° C., thereby completing the manufacture of an organic light emitting device:

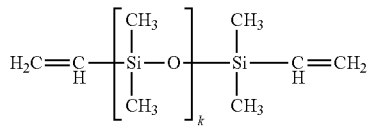

Formula 3

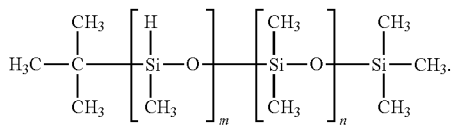

Formula 4 wherein k=about 500, m=about 2, and n=about 50.

Example 2

1000<k≦2000

The same experiment as in Example 1 was performed before loading of the filler. Then, a silicon composition including the polymer of Formula 3 and the polymer of Formula 4 in a mole ratio of 70:30 as the filler was loaded onto the LiF/Al electrode and then covered by an encapsulation substrate, and the resultant structure was compressed and cured at a temperature of 80° C., thereby completing the manufacture of an organic light emitting device.

In Formulae 3 and 4, k=about 1500, m=about 2, and n=about 80.

Comparative Example

The same experiment as in Example 1 was performed before loading of the filler. An organic light emitting device was completely manufactured in the same manner as in Example 1, except that a silicon composition including the polymer of Formula 3 and the polymer of Formula 4 in a mole ratio of 40:60 as the filler was loaded onto the LiF/Al electrode and then covered by an encapsulation substrate, and the resultant structure was compressed and cured at a temperature of 80° C.

In Formulae 3 and 4, k=about 100, m=about 2, and n=about 200.

k, m, and n of Examples 1 and 2 and Comparative Example are shown in Table 1 below and compared to each other.

| | k | m | n | m + n | 0.1 k | 0.005 k | 0.5 k |
|---|---|---|---|---|---|---|---|
| Example 1 | 500 | 2 | 50 | 52 | 50 | — | — |
| Example 2 | 1,500 | 2 | 80 | 82 | — | 7.5 | 750 |
| Comparative Example | 100 | 2 | 200 | 202 | — | — | — |

Comparison and Evaluation of Light Emitting Characteristics of Device

The organic light emitting devices manufactured according to Example 1 and Comparative Example 1 were operated and formation of dark spots was identified.

FIG. 1B is an image of the organic light emitting device of Example 1.

FIG. 1A is an image of the organic light emitting device of Comparative Example 1.

The images of FIGS. 1A and 1B were compared and it can be identified that the image of the organic light emitting device of Comparative Example 1 includes dark spots and the image of the organic light emitting device of Example 1 does not have dark spots.

The results may be obtained due to a reduction in the mobility rate of the H-polymer in the silicon composition.

As described above, according to the one or more of the above embodiments, an organic emission layer is protected from permeation of a highly reactive silicon compound (for example, H-polymer) by controlling mobility rates of silicon compounds injected into an organic light emitting device to be similar to each other, thereby hindering formation of dark spots.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. An organic light emitting device comprising a silicon composition as a filler, wherein the silicon composition comprises a silicon compound represented by Formula 1 and a silicon compound represented by Formula 2:

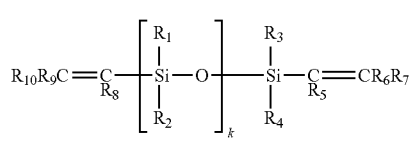

Formula 1

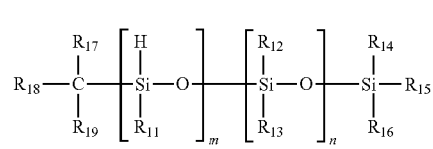

Formula 2 wherein, $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently a $C_1$-$C_4$ alkyl group, $R_5$, $R_6$, $R_7$, $R_8$, $R_9$, and $R_{10}$ are each independently hydrogen or deuterium, k, m, and n are positive integers, and the ratio of k to the sum of m and n is from about 1:0.001 to about 1:0.2.

2. The silicon composition of claim 1, wherein $R_1$, $R_2$, $R_3$, $R_4$, $R_{11}$, $R_{12}$, $R_{13}$, $R_{14}$, $R_{15}$, $R_{16}$, $R_{17}$, $R_{18}$, and $R_{19}$ are each independently methyl, ethyl, n-propyl, iso-propyl, n-butyl, sec-butyl, or t-butyl, and $R_5$, $R_6$, $R_7$, $R_8$, $R_9$, and $R_{10}$ are hydrogen atoms.

3. The silicon composition of claim 1, wherein the silicon compound represented by Formula 1 is a silicon compound represented by Formula 3:

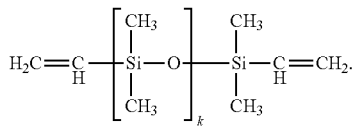

Formula 3

4. The silicon composition of claim 1, wherein the silicon compound represented by Formula 2 is a silicon compound represented by Formula 4:

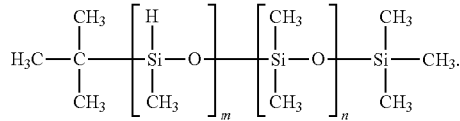

Formula 4

5. The silicon composition of claim 1, wherein the silicon compound represented by Formula 1 is a silicon compound represented by Formula 3:

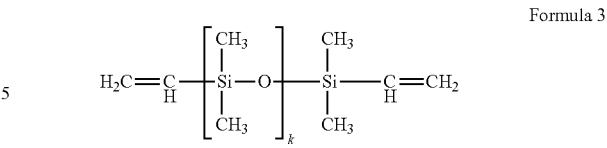

Formula 3 and
the silicon compound represented by Formula 2 is a silicon compound represented by Formula 4:

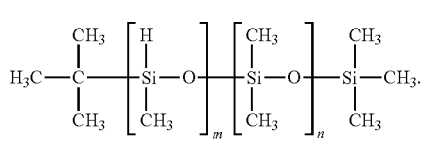

Formula 4

6. The silicon composition of claim 1, wherein $100 \leq k \leq 1,000$ and $0.1k \leq m+n \leq k$.

7. The silicon composition of claim 1, wherein when $100 \leq k \leq 1,000$, $0.1k \leq m+n \leq k$.

8. The silicon composition of claim 1, wherein $1,000 < k \leq 2,000$ and $0.005k \leq m+n \leq 0.5k$.

9. The silicon composition of claim 1, wherein when $1,000 < k \leq 2,000$, $0.005k \leq m+n \leq 0.5k$.

* * * * *